United States Patent
Park et al.

(10) Patent No.: US 7,687,837 B2
(45) Date of Patent: Mar. 30, 2010

(54) IMAGE SENSOR AND FABRICATION METHOD THEREOF

(75) Inventors: Young-Hoon Park, Suwon-si (KR); Jae-Ho Song, Suson-si (KR); Won-Je Park, Suwon-si (KR); Jin-Hyeong Park, Seoul (KR); Jeong-Hoon Bae, Seoul (KR); Jung-Ho Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 628 days.

(21) Appl. No.: 11/542,340

(22) Filed: Oct. 3, 2006

(65) Prior Publication Data

US 2007/0075338 A1    Apr. 5, 2007

(30) Foreign Application Priority Data

Oct. 4, 2005    (KR) .................. 10-2005-0093103

(51) Int. Cl.
    *H01L 31/113*    (2006.01)
(52) U.S. Cl. .................. 257/294; 257/291; 257/292; 257/293; 257/E33.076; 257/E31.121; 257/E31.122; 257/E27.13; 257/E27.133; 257/E27.134
(58) Field of Classification Search ............... 257/233, 257/292, 294, E33.076, E31.121, E31.122, 257/E27.134, E27.133, E27.13, 291
See application file for complete search history.

(56) References Cited

U.S. PATENT DOCUMENTS

| | | | |
|---|---|---|---|
| 6,885,047 B2* | 4/2005 | Shinohara et al. | 257/292 |
| 7,151,287 B1* | 12/2006 | Scheffer et al. | 257/292 |
| 2005/0224844 A1* | 10/2005 | Mizuguchi | 257/233 |

FOREIGN PATENT DOCUMENTS

| | | |
|---|---|---|
| JP | 2004-273781 | 9/2004 |
| JP | 20050051136 | 2/2005 |
| KR | 2003-0090871 | 12/2003 |
| KR | 20040008732 | 1/2004 |

OTHER PUBLICATIONS

English Abstract Publication No. 1020030090871, Jan. 06, 2007.
English Abstract of Publication No. 2005-051136, Jun. 25, 2006.
English Abstract of Publication No. 10-2004-0008732, Jun. 25, 2006

* cited by examiner

*Primary Examiner*—Long K Tran
(74) *Attorney, Agent, or Firm*—F. Chau & Associates, LLC

(57) ABSTRACT

An image sensor includes a substrate having an active pixel sensor region defined therein, a plurality of first conductivity type photodiodes formed in the active pixel sensor region and a first conductivity-type first deep well formed in the active pixel sensor region in a location which does not include the plurality of the first conductivity-type photodiodes. Moreover, the first deep well is electrically connected to a positive voltage.

15 Claims, 11 Drawing Sheets

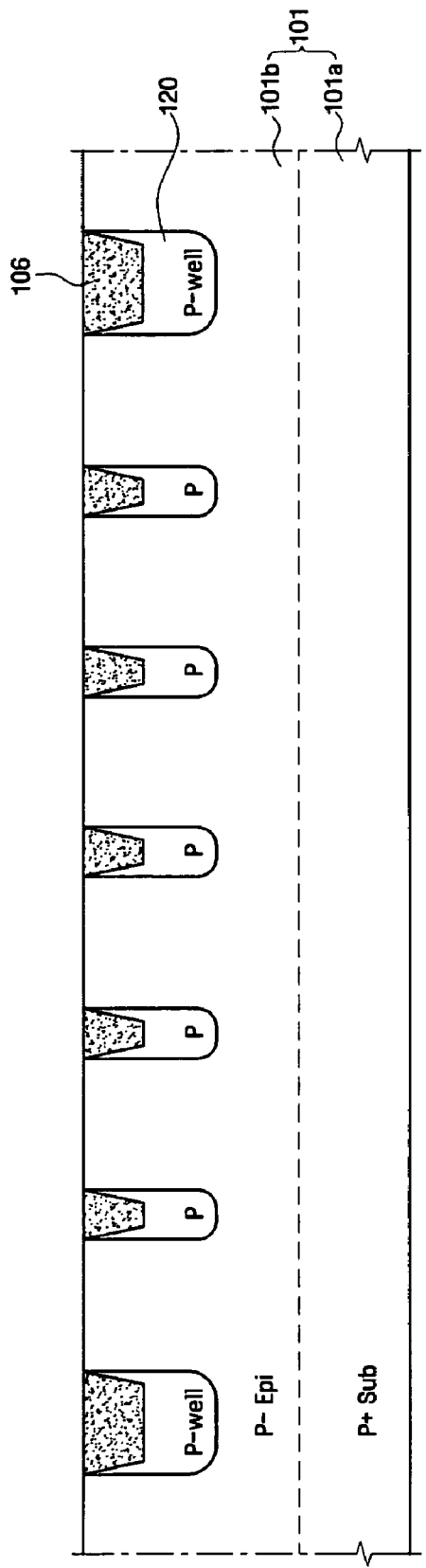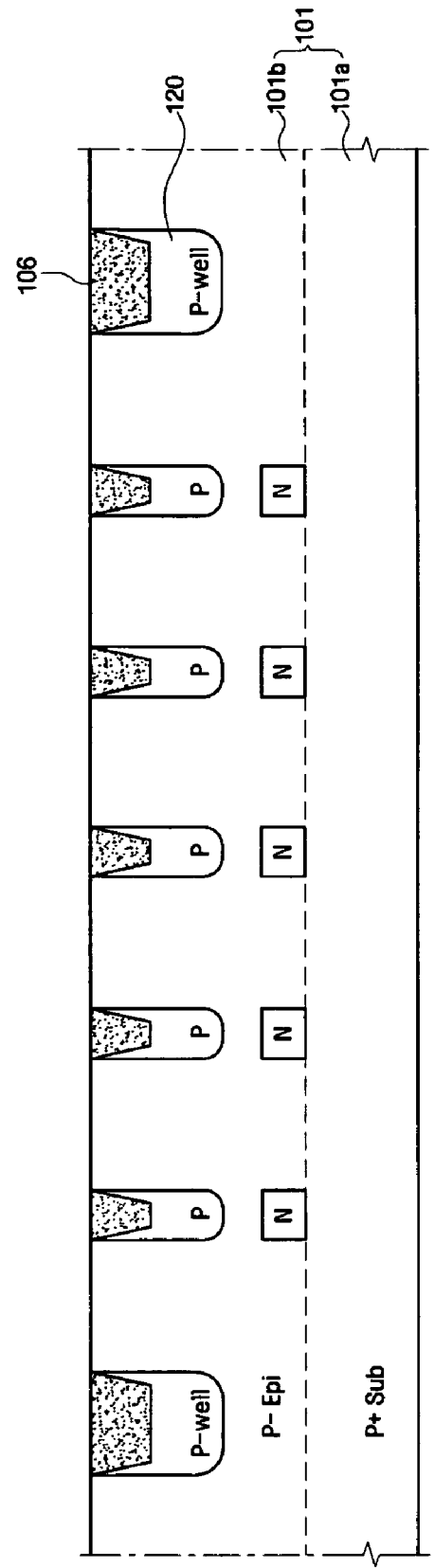

IMAGE SENSOR AND FABRICATION METHOD THEREOF

CROSS-REFERENCE TO RELATED APPLICATION

This application is based on and claims priority from Korean Patent Application No. 10-2005-0093103 filed on Oct. 4, 2005 the disclosure of which is hereby incorporated by reference herein in its entirety.

BACKGROUND OF THE INVENTION

1. Technical Field

The present disclosure relates to an image sensor and a fabrication method thereof, and more particularly to an image sensor having reduced crosstalk between pixels, and a fabrication method thereof.

2. Description of the Prior Art

An image sensor is a device that may convert optical images into electrical signals. The demand for devices with image sensors having improved performance such as, for example, digital cameras, camcorders, PCSs (Personal Communication Systems), gang machines, security cameras, micro-cameras for medical applications, and robots has increased.

A metal oxide semiconductor (MOS) image sensor is driven in a simple and relatively easy manner and can be embodied using various scanning methods. Also, MOS processing technology allows for the miniaturization of products and also reduces production costs because signal processing circuits can be integrated onto a single chip. Moreover, MOS image sensors have very low power consumption, and thus can be applied to products having limited battery capacity. Furthermore, with MOS image sensors high resolution may be achieved for products used in conjunction therewith. Accordingly, the demand for the MOS image sensor is increasing.

The pixel of the MOS image sensor photoelectrically converts incident light to accumulate charges corresponding to the amount of the light in a photodiode, and then reproduces image signals in a read-out operation. However, the charges produced by incident light may not accumulate in the photodiode of the corresponding pixel, but may instead move to and accumulate in the photodiode of an adjacent pixel, causing crosstalk between pixels.

As shown in FIG. 1, crosstalk between pixels can be divided into two categories: optical crosstalk A and electrical crosstalk B. For example, optical crosstalk A refers to when light incident through a microlens and/or a color filter is not transferred to a desired pixel, but is instead transferred to the photodiode of an adjacent pixel due to refracted light resulting from refraction from the following surfaces: (a) the surface of a multilayer structure consisting of interlayer insulating films 3, 4 and 5 having different refractive indexes, (b) the surface of non-uniform films, or (c) reflected light 6 resulting from reflection from the upper or side surface of metal interconnections M1, M2 and M3. Next, electrical crosstalk B refers, for example, to when charges produced in the bottom or side of a photodiode are transferred to the photodiode 2 of the adjacent pixel due to long-wavelength incident light 7.

When crosstalk occurs, in the case of black and white image sensors, the distortion of images can occur due to a reduction in resolution. Also, in the case of color image sensors including a color filter array (CFA) having red, green and blue filters, the possibility of crosstalk due to incident long-wavelength red light is higher, thereby possibly resulting in poor tint. In addition, a blooming phenomenon, in which adjacent pixels in a picture become hazy, may also occur.

Thus, there is a need for an improved image sensor which provides reduced crosstalk between pixels and for a method of fabricating the same.

SUMMARY OF THE INVENTION

In accordance with an exemplary embodiment of the present invention, an image sensor is provided. The image sensor includes a substrate having an active pixel sensor region defined therein, a plurality of first conductivity type photodiodes formed in the active pixel sensor region and a first conductivity-type first deep well formed in the active pixel sensor region, in a location which does-not include the plurality of first conductivity type photodiodes. In addition, the first deep well is electrically connected to a positive voltage.

In accordance with an exemplary embodiment of the present invention, an image sensor is provided. The image sensor includes a substrate having an active pixel sensor region and a peripheral region defined therein, an active pixel sensor array formed in the active pixel sensor region and including a plurality of first conductivity type photodiodes arranged in a matrix form, a first conductivity type guard ring formed in the peripheral region so as to surround the active pixel sensor array and a first conductivity-type first deep well formed in the active pixel sensor region, in a location which does not include the plurality of first conductivity-type photodiodes. The first deep well is connected to the guard ring and is adapted to receive a positive voltage through the guard ring.

In accordance with an exemplary embodiment of the present invention, a method of fabricating an image sensor is provided. The method includes providing a substrate having an active pixel sensor region defined therein, forming a first conductivity-type first deep well in the active pixel sensor region; and forming a plurality of photodiodes in the active pixel sensor region in a location which does not include the first conductivity-type first deep well.

In accordance with an exemplary embodiment of the present invention, a method of fabricating an image sensor is provided. The method includes providing a substrate having an active pixel sensor region and a peripheral region defined therein, forming a first conductivity-type first deep well in the active pixel region, forming in the peripheral region a first conductivity type guard ring, which is connected to the first conductivity-type first deep well and forming an active pixel sensor array in the active pixel sensor region in a location which does not include the first conductivity-type first deep well. The active pixel sensor array includes a plurality of first conductivity type photodiodes arranged in a matrix form. Moreover, the first conductivity type guard ring surrounds the active pixel sensor array.

BRIEF DESCRIPTION OF THE DRAWINGS

Exemplary embodiments of the present invention will be more clearly understood from the following detailed description taken in conjunction with the accompanying drawings, in which:

FIGS. 10A to 10C are cross-sectional views for explaining the intermediate steps of a method of fabricating an image sensor according to an exemplary embodiment of the present invention.

DETAILED DESCRIPTION OF THE EXEMPLARY EMBODIMENTS

Hereinafter, the present invention will be described in further detail with exemplary embodiments thereof shown in the accompanying drawings. However, the present invention is not limited to the exemplary embodiments described below and can be embodied in a variety of different forms.

Although, the exemplary embodiments of the present invention described hereinafter illustrate only complementary metal oxide semiconductor (CMOS) image sensors, other image sensors may also be used in accordance with the exemplary embodiments of the present invention, such, as for example, all image sensors formed using an N-channel metal oxide semiconductor (NMOS) or P-channel metal oxide semiconductor (PMOS) process alone or a CMOS process that utilizes both the NMOS and PMOS processes.

Figure 2:
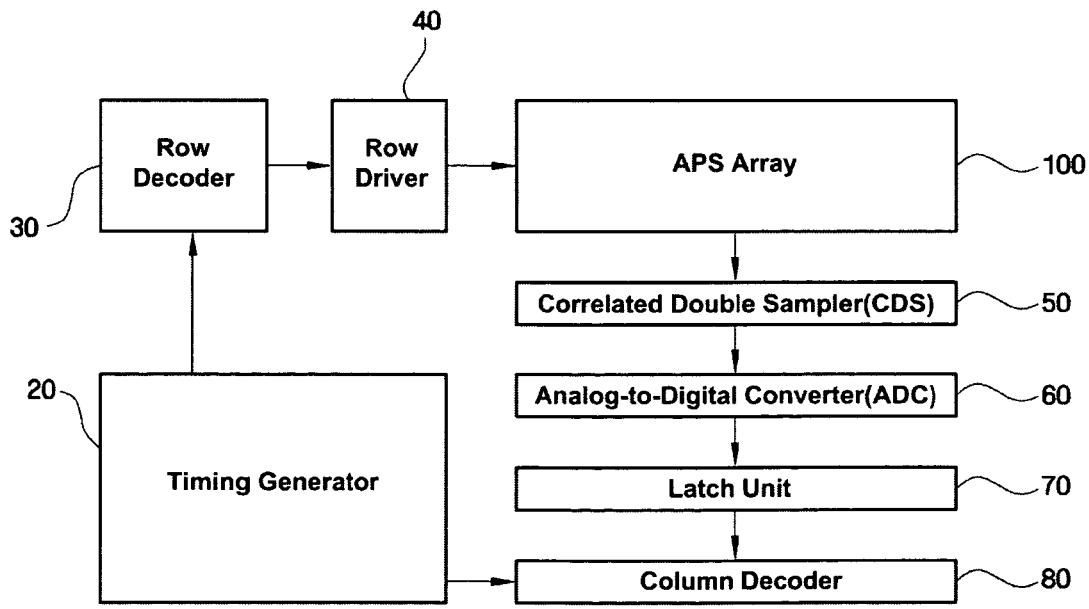
FIG. 2 is a block diagram of an image sensor according to an exemplary embodiment of the present invention.

FIG. 2 is a block diagram of an image sensor according to an exemplary embodiment of the present invention.

Referring to FIG. 2, the image sensor includes, for example, an active pixel sensor (APS) array 100 having pixels arranged in a plane and including photodiodes, a timing generator 20, a row decoder 30, a row driver 40, a correlated double sampler (CDS) 50, an analog-to-digital converter (ADC) 60, a latch unit 70 and a column decoder 80.

The pixel array section 100 includes a plurality of pixels arranged in a plane. For example, the pixels may be formed in a matrix. The pixels serve to convert light into electrical signals. The pixel array section 100 is driven by receiving from the row driver 40 a plurality of driving signals, including a pixel selection signal (ROW), a reset signal (RST) and a charge transfer signal (TG). Also, the electrical signal is provided to the correlated double sampler 50 via a vertical signal line.

The timing generator 20 provides timing and control signals to the row decoder 30 and the column decoder 80.

The row driver 40 provides a plurality of driving signals to the pixel array section 10 on the basis of results decoded in the row decoder 30. Generally, when the unit cells are arranged in a matrix form, the driving signals will be provided to each row.

The correlated double sampler 50 receives the electrical signal formed in the pixel sensor array 100 via the vertical signal line and holds and samples the received electrical signal. In other words, the correlated double sampler 50 doubly samples a specific noise level and a signal level caused by the formed electrical signal, and it outputs a difference level corresponding to the difference between the noise level and the signal level.

The analog-to-digital converter 60 converts an analog signal corresponding to the difference level to a digital signal, and outputs the converted digital signal.

The latch unit 70 latches the digital signal, and the latched signal is sequentially output to an image signal processing section on the basis of a result decoded in the column decoder 80.

Figure 3:
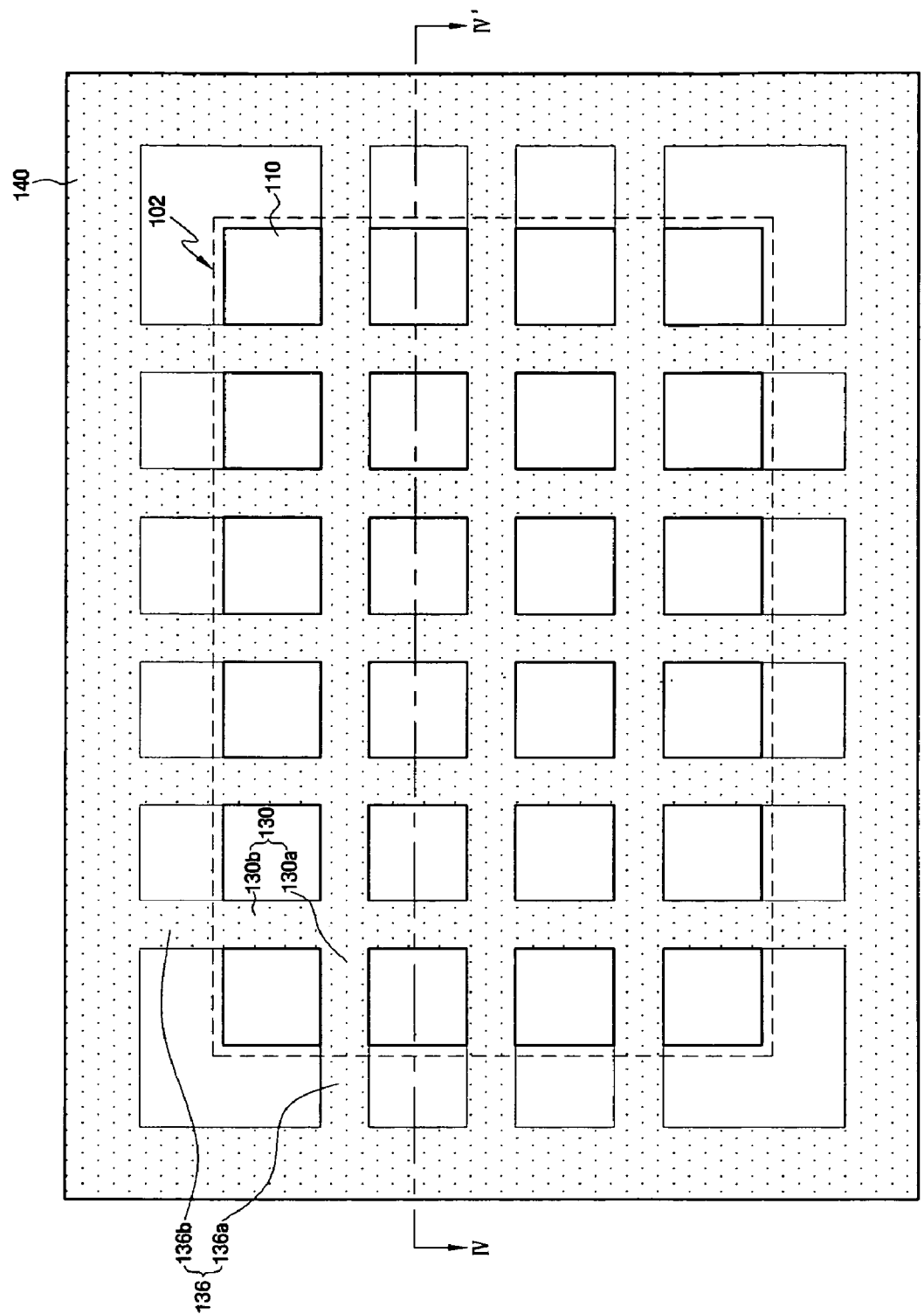
FIG. 3 is a layout diagram schematically showing an active pixel sensor array and a guard ring in an image sensor according to an exemplary embodiment of the present invention.
Figure 4:
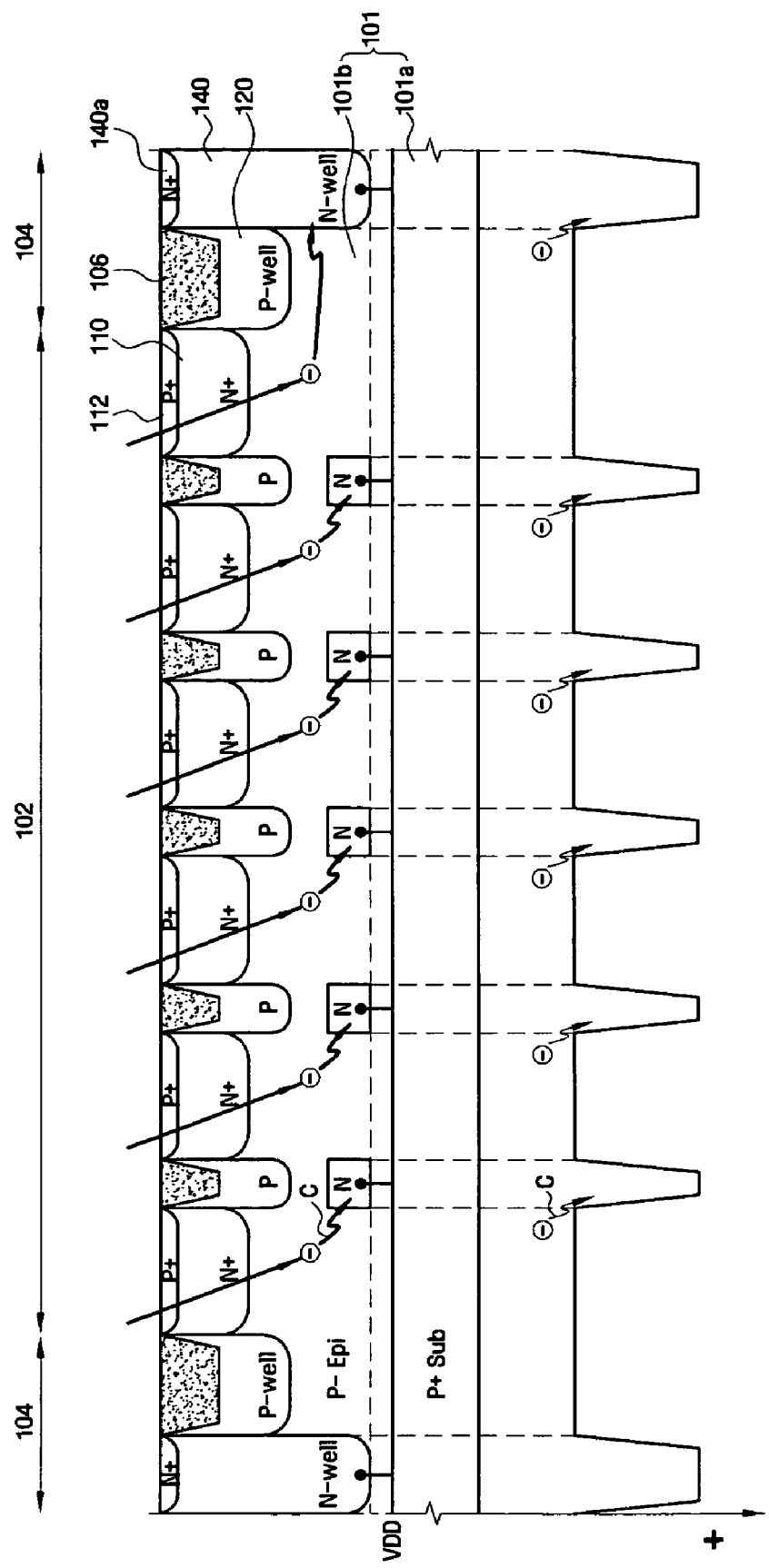
FIG. 4 is a cross-sectional view taken along line IV-IV' of FIG. 3.

FIG. 3 is a layout diagram schematically showing the active pixel sensor array and guard ring of an image sensor according to exemplary embodiment of the present invention. FIG. 4 is a cross-sectional view taken along line IV-IV' of FIG. 3.

Referring to FIGS. 3 and 4, the image sensor includes, for example, a substrate 101, an active pixel sensor array 100, a first conductivity-type (e.g., N type) first deep well 130, and a guard ring 140.

As shown in FIG. 4, the substrate 101 may include, for example, a second conductivity type (e.g., P type) semiconductor substrate 101a, and a second conductivity type epitaxial layer 101b formed on the second conductivity type semiconductor substrate 101a, but is not limited thereto. For example, the substrate 101 may include a second conductivity type semiconductor substrate and a first conductivity type epitaxial layer formed on the second conductivity type semiconductor substrate. Alternatively, the substrate 101 may include, for example, a first conductivity type semiconductor substrate and a first or second conductivity type epitaxial layer formed on the first conductivity type semiconductor substrate.

Also, in the substrate 101, an element isolation film 106 is formed to define an active region. As shown in FIG. 4, the element isolation film 106 may be a STI (Shallow Trench Isolation) or FOX (Field Oxide) type formed using LOCOS (Local Oxidation of Silicon).

Below the element isolation film 106, a second conductivity type (e.g., P type) isolation well 120 can be formed. The isolation well 120 functions to isolate a plurality of photodiodes 110 from each other. Moreover, to reduce the horizontal crosstalk between the photodiodes 110, the isolation well 120 can be formed to a depth that is substantially the same or deeper than that of the photodiodes 110.

Figure 1:
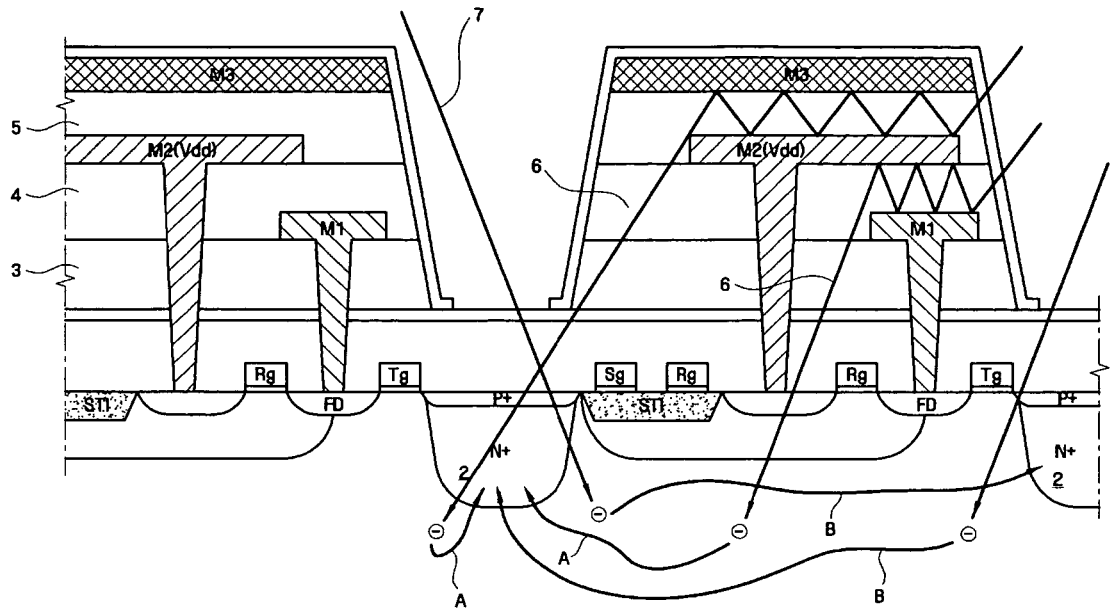
FIG. 1 is a diagram illustrating crosstalk.

Meanwhile, the substrate 101 can be divided into an active pixel sensor region 102 and a peripheral region 104. In other words, the active pixel sensor region 102 has formed therein an active pixel sensor array 100, and the peripheral region 104 has formed therein penpheral circuits excluding the active pixel sensor array 100. For example, in the peripheral region 104, a row decoder (30 in FIG. 1), a row driver (40 in FIG. 1), a correlated double sampler (50 in FIG. 1), an analog-to-digital converter (60 in FIG. 1), a latch unit (70 in FIG. 1), a column decoder (80 in FIG. 1), may be formed.

The active pixel sensor array 100 is formed in the active pixel sensor region 102, and the plurality of pixels arranged in a matrix form may include the first conductivity type photodiodes 110. In exemplary embodiments of the present invention, the configuration of the pixels constituting the active pixel sensor array 100 is not limited to a specific configuration. For example, the pixel may be an individual pixel in which each of the photodiodes has a read-out element, a 2-shared pixel comprising two photodiodes sharing the read-out element, and a 4-shared pixel comprising four photodiodes sharing the read-out element These shared pixels can reduce the area of the read-out element and increase the light-receiving efficiency because the reduced area of the read-out element can be used to increase the size of the photodiode. Also, these shared pixels can improve, for example, the photosensitivity and the amount of saturated signal of the image sensor. A 2-shared pixel in accordance with an exemplary embodiment of the present invention will be described below with reference to FIGS. 5-9.

The first conductivity type photodiode 110 accumulates generated charges corresponding to the incident light, and a pinning layer 112 selectively formed on the first conductivity type photodiode 110 serves to prevent dark currents by reducing thermally generated EHPs (electron-hole pairs) on the substrate 101. In other words, among thermally generated EHPs caused by dangling bonds on the surface of the substrate 101, positive charges are diffused to the grounded substrate via the P-type pinning layer 112, and negative charges disappear by recombining with the positive charges during diffusion through the pinning layer 112. Meanwhile, because incident long-wavelength light (e.g., incident light in the red region), is incident to a depth far below the surface of the substrate 101, photoelectric conversion occurs also in a substrate region below the photodiode 110.

A first conductivity type (e.g., N type) first deep well 130 is formed in the active pixel sensor region 102 in a location which does not include the first conductivity type photodiodes 110. For example, as shown in FIG. 3, the first deep well 130 may comprise a plurality of first sub-first deep wells 130a, extending parallel to one axis of the active pixel sensor array 100 arranged in a matrix form, and a plurality of second sub-first deep wells 130b, extending parallel to the other axis perpendicular to the one axis, and wherein the plurality of first sub-first deep wells 130a and the plurality of second sub-first deep wells 130b cross each other.

Also, the first conductivity type first deep well 130 is connected to positive voltage. The positive voltage may be, for example, power supply voltage VDD, but is not limited hereto.

This first conductivity type first deep well 130 can reduce electrical crosstalk in which negative charges generated by the incidence of light are transferred to the photodiode 110 of the adjacent pixel but not to the photodiode 110 of the corresponding pixel on which the light was incident. Additionally, because long-wavelength incident light (e.g., incident light in the red region), is incident to a depth far below the surface of the substrate 101, EHPs can be generated not only in the photodiode 110, but also in the substrate 101 below the photodiode 110, and negative charges generated by long-wavelength incident light may be moved to the photodiode 100 of the adjacent pixel, but not to the corresponding pixel. However, in exemplary embodiments of the present invention, because the first deep well 130 electrically connected to positive voltage is located in the moving path of negative charges to the adjacent photodiode 110 and has a potential higher than that of the periphery thereof, it can pull and drain the negative charges (see a potential diagram and reference number C in FIG. 4) so as to reduce electrical crosstalk. As a result, image distortion, poor tint and blooming all may be reduced, thereby improving the image reproduction characteristics of the image sensor.

In addition, because the first deep well 130 is not located below the photodiode 110, a photoelectric conversion region in which EHPs are generated by incident light can be sufficiently secured. As described above, because long-wavelength light is incident to a depth far below the surface of the substrate 101, EHPs may be generated in a region of the substrate 101 below the photodiode 110. Thus, when the first deep well 130 is located below the photodiode 110 as well, the region in which EHPs are generated by long-wavelength incident light may be significantly decreased. Also, as most generated negative charges can be drained through the first deep well 130, sensitivity to long-wavelength incident light may be decreased.

The first deep well 130 is formed to a depth of about 1 to about 5 micrometers (μm) from the surface of the substrate and may have a peak doping concentration of about $1\times10E12$ atoms/cm$^3$ to about $1\times10E14$ atoms/cm$^3$. For example, the first deep well 130 may have a peak doping concentration of about $1\times10E13$ atoms/cm$^3$ at a depth of about 1.5 μm from the surface of the substrate. However, because the specified ranges of the depth and the peak doping concentration may vary depending on the image sensor to which the first deep well 130 is applied, the exemplary embodiments of the present invention are not limited to the specified ranges for the depths and doping concentrations.

The guard ring 140 is formed in the peripheral region 104 so as to surround the active pixel sensor array 100, and may be a first conductivity type (e.g., N type) similar to the first deep well 130. The guard ring 140 is electrically connected to the first deep well 130 so that it will provide the first deep well 130 with positive voltage, for example, power supply voltage (VDD). In other words, in this exemplary embodiment, the guard ring 140 is connected with a plurality of contacts connected to metal lines for transferring positive voltage, so that positive voltage is provided to the first deep well 130 through the guard ring 140. On the surface of the substrate 101 having the guard ring 140 formed thereon, an ohmic contact layer 140a may be formed to provide improved contact properties between the contacts and the guard ring 140.

As the guard ring 140 should be connected to the first deep well 130, it should be formed from the surface of the substrate 101 to a depth to which the first deep well 130 is formed. For example, the guard ring 140 can be formed to a depth of about 1 to about 5 μm, but is not limited thereto.

Also, the guard ring 140 located in the peripheral region 104 maybe connected to the first deep well 130 located in the active pixel sensor region 102 through a first conductivity type connection well 136 located in the peripheral region 104. As shown in FIG. 3, the connection well 136 may comprise a plurality of first sub-connection wells 136a connected to a plurality of first sub-first deep wells 130a, respectively, and a plurality of second sub-connection wells 136b connected to a plurality of second sub-first deep wells 130b, respectively.

Hereinafter, 2-shared pixels arranged in the active pixel sensor array of an image sensor in accordance-with an exemplary embodiment of the present invention will be described with reference to FIGS. 5 to 9.

Figure 5:
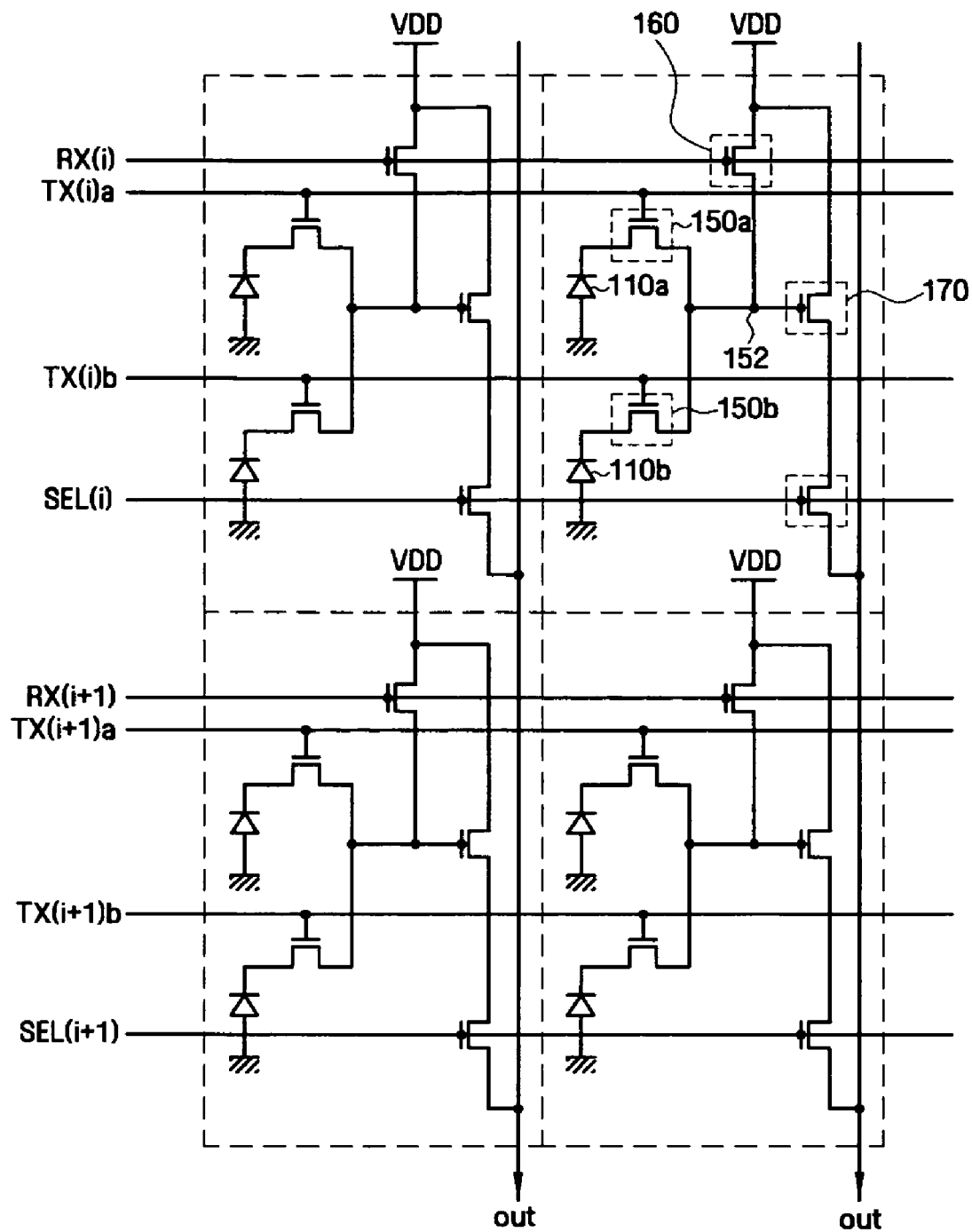
FIG. 5 is a circuit diagram of an image sensor according to an exemplary embodiment of the present invention.
Figure 6:
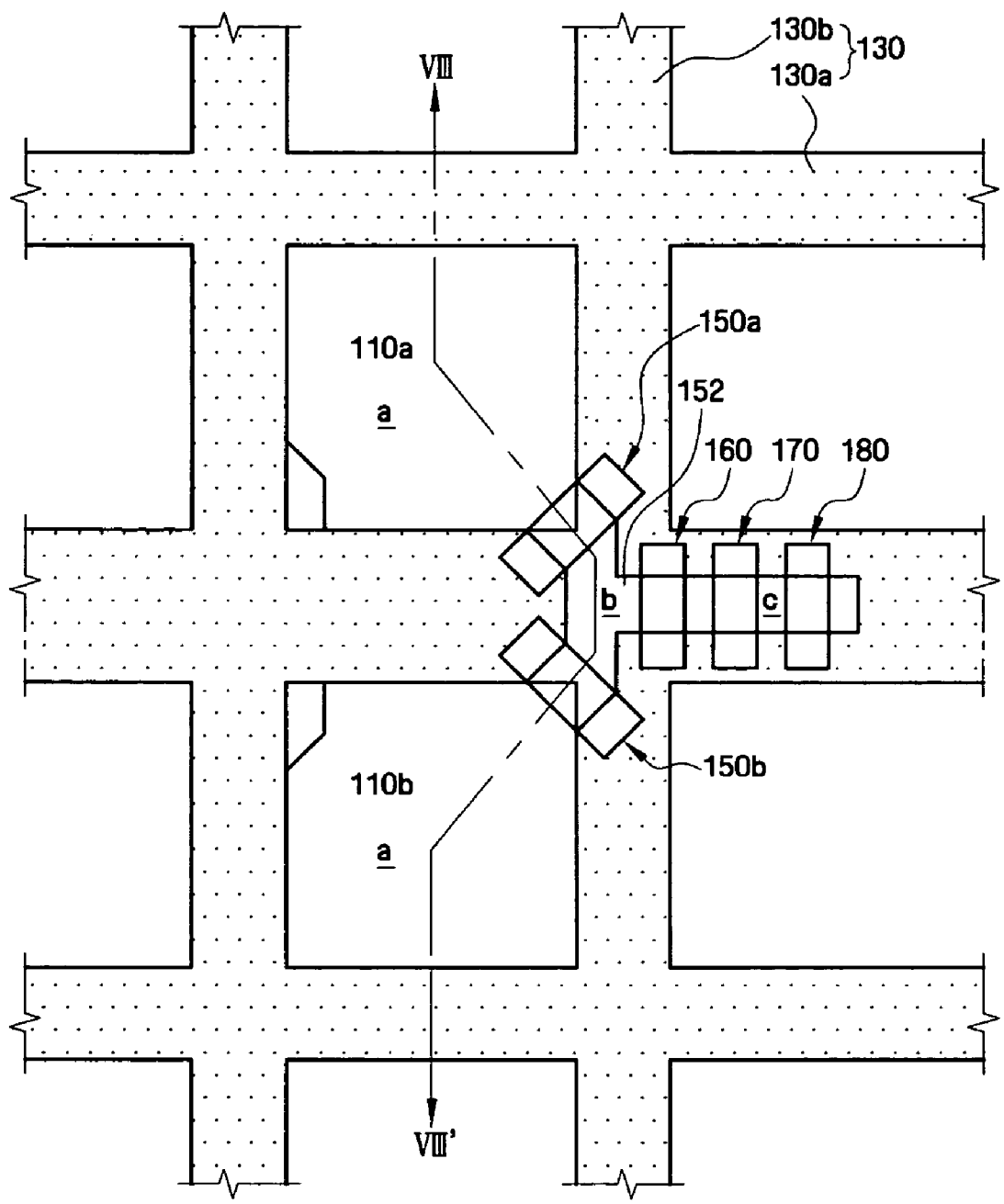
FIG. 6 is a partial layout diagram of an image sensor according to an exemplary embodiment of the present invention.
Figure 7:
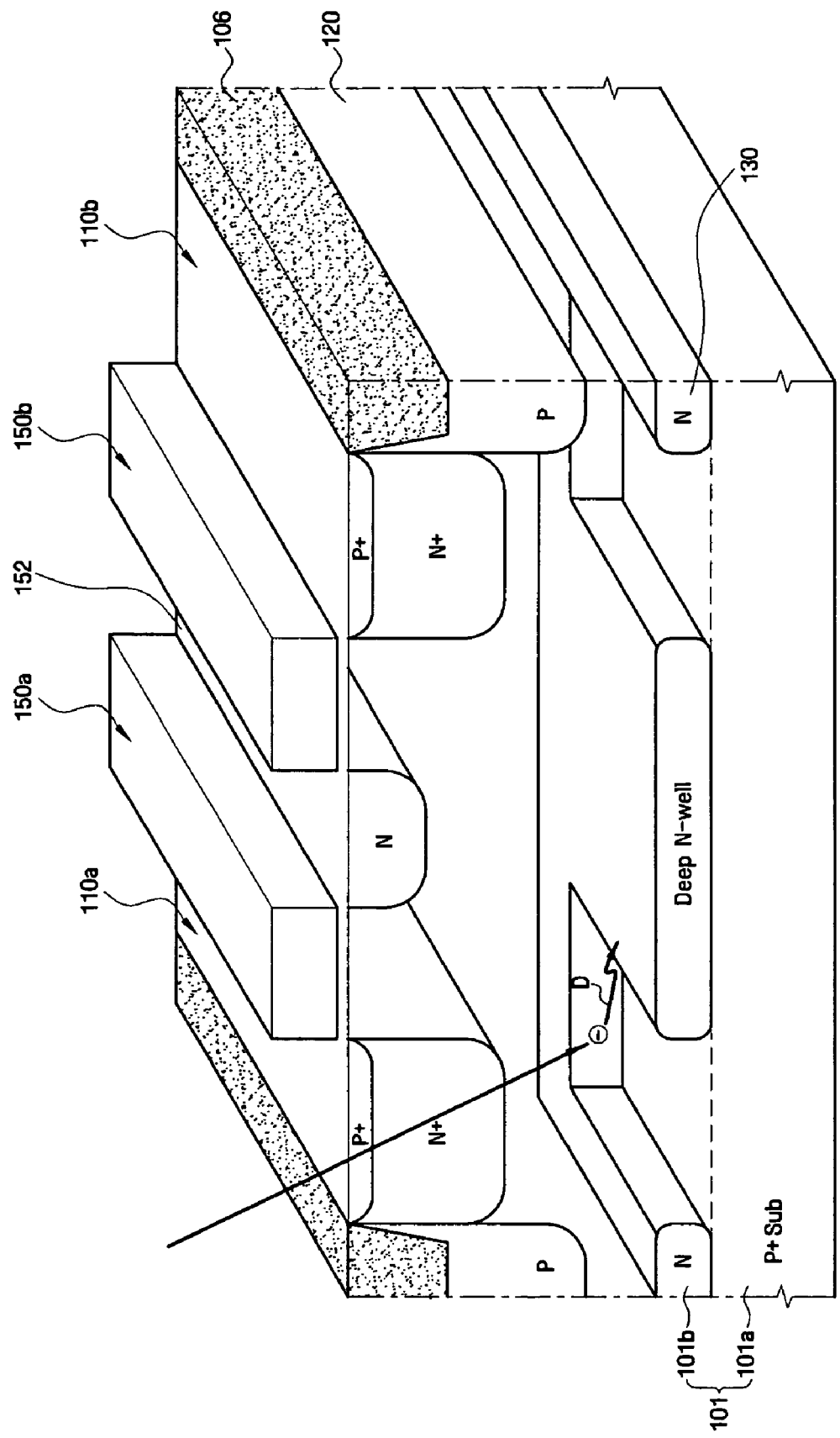
FIG. 7 is a cross-sectional view taken along ling VII-VII' of FIG. 6.

FIG. 5 is a circuit diagram of an image sensor according to an exemplary embodiment of the present invention, FIG. 6 is a partial layout view of the image sensor according to an exemplary embodiment of the present invention, and FIG. 7 is a cross-sectional view taken along line VII-VII' of FIG. 6.

Referring to FIG. 5, the active pixel sensor array (see 100 in FIG. 2), having 2-shared pixels P arranged in a matrix form, is first constructed. As used herein, the term "2-shared pixel (P)" means that two photodiodes share read-out elements. The read-out elements which are used in the present exemplary embodiment serve to read out an optical signal incident to the photodiode and may include, for example, a drive element, a reset element and/or a select element.

The 2-shared pixel (P) comprises two photodiodes 110a and 110b. The photodiodes 110a and 110b absorb incident light and accumulate charges corresponding to the amount of light. The photodiodes 110a and 110b may be substituted with any element capable of accumulating charges corresponding to incident light. For example, these photodiodes may be substituted with a phototransistor, a photogate, a pinned photodiode or a combination thereof.

Each of the photodiodes 110a and 110b is electrically connected to each of charge transfer elements 150a and 150b that transfer the charges accumulated in the photodiodes to a floating diffusion region (FD) 152. The floating diffusion region 152, which is a region for converting charges to voltage, cumulatively stores charges, because it has parasitic capacitance.

The 2-shared pixel P comprises two photodiodes 110a and 110b which share read-out elements, including the drive element 170, the reset element (160) and the select element 180. With respect to the function of the 2-shared pixels, i-matrix pixels (P(i, j), P(i, j+1i), . . . ) will now be described by way of example.

The drive element 179, illustrated as a source follower amplifier, amplifies a change in the electrical potential of the floating diffusion region 152 transferred with the charges accumulated in each of the photodiodes 110 and outputs the amplified signal to an output line (Vout).

The reset element 160 periodically resets the floating diffusion region 152. The reset element 160 may consist of one MOS transistor that is driven by a bias provided from a reset line RX(i) for applying a given bias. When the reset element 160 is turned on by a bias provided from the reset line RX(i), a given electrical potential connected to the drain of the reset element 160, for example, power supply voltage (VDD), is transferred to the floating diffusion region 152.

The select element 180 functions to select a 2-shared pixel to be read out in a raw unit The select element 180 can consist of, for example, one MOS transistor which is driven by a bias provided by a row selection line SEL(i). When the select element 180 is turned on by a bias provided by the row selection line SEL(i), a given electrical potential electrically connected to the drain of the select element 180, for example, power supply voltage VDD, is transferred to the drain region of the drive element 170.

Transfer lines TX(i)a and TX(i)b for applying a bias to the charge transfer elements 150a and 150b, the reset line RX(i) for applying a bias to the reset element 160, and the row selection line SEL(i) for applying a bias to the selection element 180, can be extended and arranged substantially parallel with each other in a row direction.

Referring to FIGS. 6 and 7, a 2-shared pixel is formed on an axis-merged dual lobe-type active region. For example, the active region consists of a dual lobe active region "a" merged with a one-axis active region "b" through a connection active region "c". The lobe-like portions of the dual lobe active region "a" are opposite each other in one direction, for example, a row direction, with respect to the one-axis active region "b". Accordingly, the entire appearance of the one axis-merged dual lobe-type active region is substantially similar to the appearance of a structure consisting of the hypocotyl of a dicotyledonous plant and two cotyledons extending from the hypocotyl. The dual lobe-type active region "a" is an active region on which two photodiodes 110a and 110b are to be formed, and the connection active region "c" is an active region on which the floating diffusion region is to be formed. If the floating diffusion region 152 is formed so as to be shared by two photodiodes 110a and 110b, the size of the connection active region "c" to be formed with the floating diffusion region 152 can be reduced. Consequently, as this reduction in size can lead to a reduction in parasitic capacitance, charges transferred to the floating diffusion region 152 can be sufficiently used as voltage for driving the drive element.

Accordingly, the transfer gates of two charge transfer elements 150a and 150b are each formed between the dual lobe active region "a" and connection active region "c" of the one axis-merged dual lobe-type active region, such that charges accumulated in two photodiodes 110a and 110b can be transferred to the floating diffusion region 152. Also, the gates of a plurality of read-out elements 160, 170 and 180 can be formed on the axis active region "b" connected to the connection active region "c", such that they can read out charges transferred to the floating diffusion region 152. Herein, the gates of the read-out elements 160, 170 and 180 can be a reset gate, a drive gate and a select gate, respectively, and can be formed parallel to each other in one direction.

It can be seen that the first deep well 130 is formed in a region which does not include the first conductivity type photodiodes 110a and 110b, (e.g., a region on which the floating diffusion region and the read-out elements 160, 170 and 180 are to be formed). In addition, it can be seen that the first deep well is not formed in the dual lobe active region "a", but is formed on the axis active region "c".

When the first deep well 130 as described above is used in a shared pixel (e.g., the 2-shared pixel P) wherein pluralities of the photodiodes 110a and 110b share one floating diffusion region 152 and the read-out elements 160, 170 and 180, the following benefits may be obtained. For example, negative charges generated by light incident through one photodiode 110a of the 2-shared pixel P may be prevented not only from being moved directly to another photodiode 110b to cause crosstalk, but also from being moved to the floating diffusion region 152 so as to also prevent an inaccurate read out of the negative charges accumulated in the other photodiode 110b from occurring (see reference numeral "D").

Figure 8:
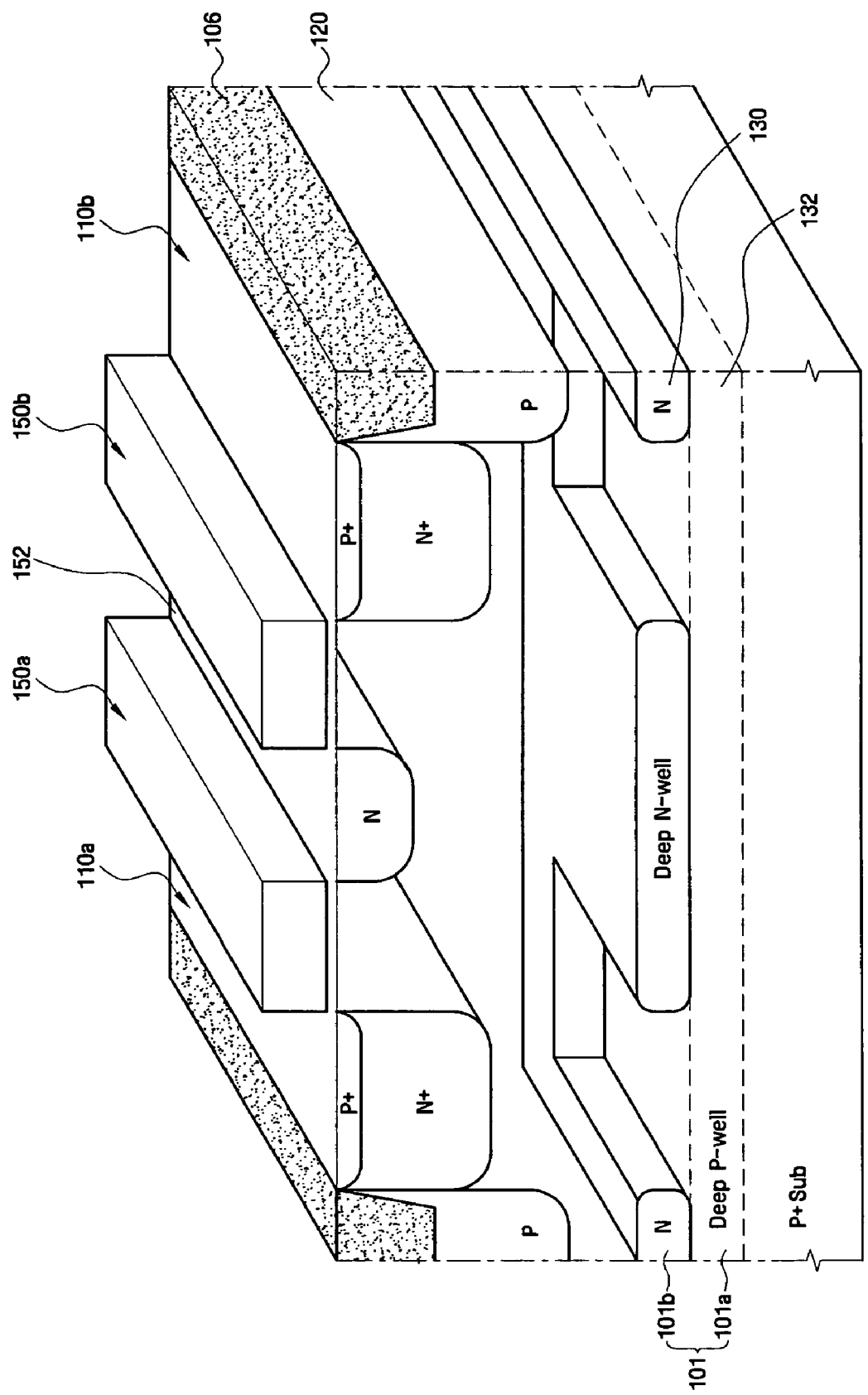
FIG. 8 is a diagram illustrating an image sensor according to an exemplary embodiment of the present invention.

FIG. 8 is a drawing for explaining an image sensor according to a second exemplary embodiment of the present invention. In FIG. 8, substantially the same elements as those in FIG. 7 will be designated by the same reference numerals and explanations thereof will be omitted.

Referring to FIG. 8, the difference between the second exemplary embodiment of the present invention and the exemplary embodiment as previously described above is that a second conductivity-type second deep well 132 is formed at a position deeper than the first conductivity-type first deep well 130.

The second deep well 132 functions to form a potential barrier so as to prevent charges produced at a deep location in the substrate 101 from flowing into the photodiodes 110, and functions to increase the recombination of charges with holes. Accordingly, the second deep well 132 may reduce crosstalk between pixels, caused by the random drift of charges.

The second deep well 132 may be formed to a depth of, for example, about 2 to about 12 μm from the surface of the substrate 101. In this respect, the depth of about 2 to about 12 μm is substantially the same as the absorption length of red or near-infrared region light in silicon. As the depth of the second deep well 132 from the surface of the substrate 101 decreases, its effect of preventing the diffusion of charges increases, thereby leading to a reduction in crosstalk. However, as a result, the region of the photodiode 110 also becomes shallow, and thus its sensitivity to long-wavelength (e.g., red) incident light, having a relatively high photoelectric conversion rate at a deep location, can be lowered. For this reason, the location at which the second deep well 132 is formed can be adjusted depending on the wavelength range of incident light.

Figure 9:
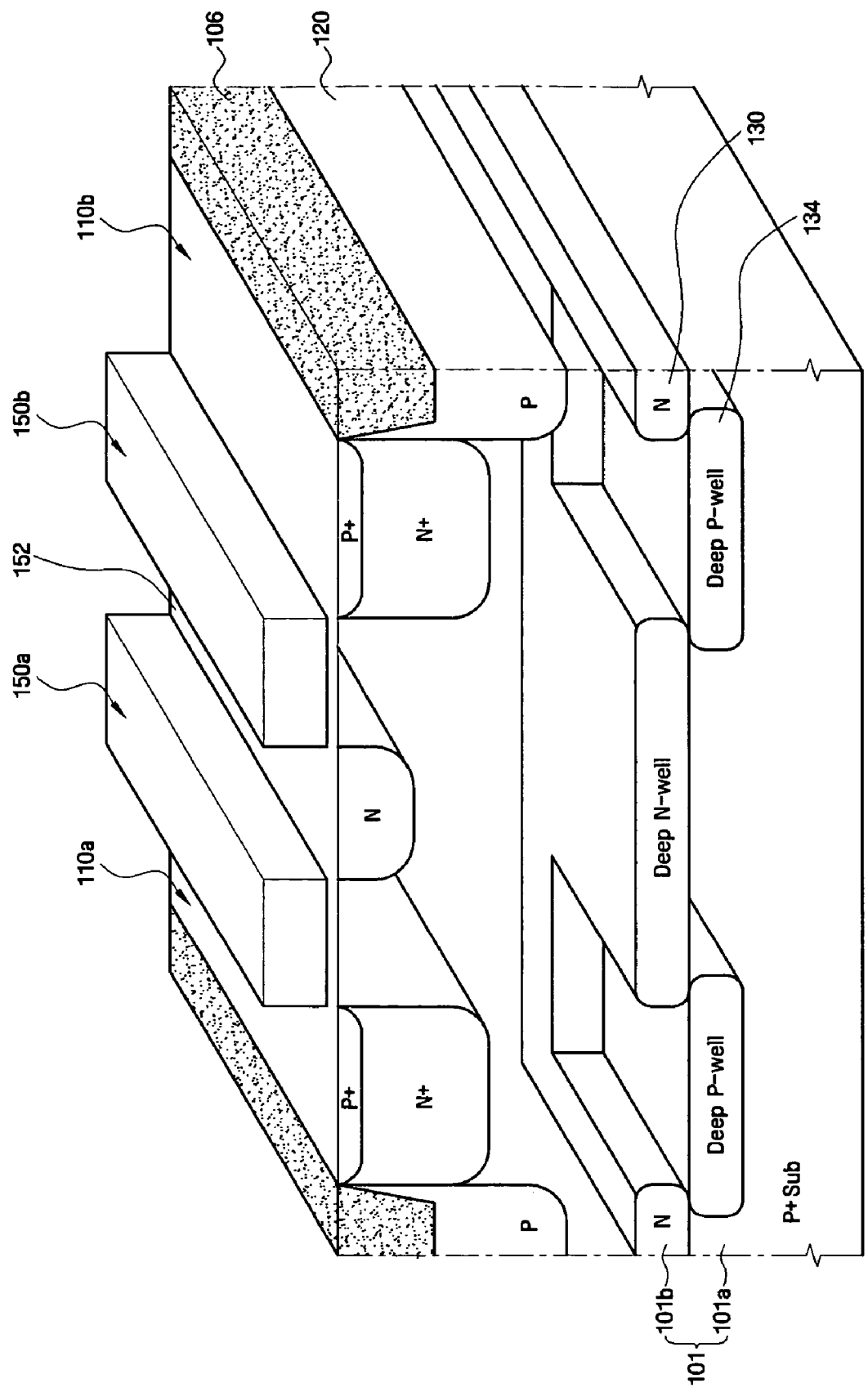
FIG. 9 is a diagram illustrating an image sensor according to an exemplary embodiment of the present invention.

FIG. 9 is a drawing for explaining an image sensor according to a third exemplary embodiment of the present invention. Referring to FIG. 9, the difference between the image sensor according to the third exemplary embodiment of the present invention and the image sensor according to the second exemplary embodiment is that the second conductivity-type second deep well 132 is formed only below the photodiode 110.

Figure 10C:
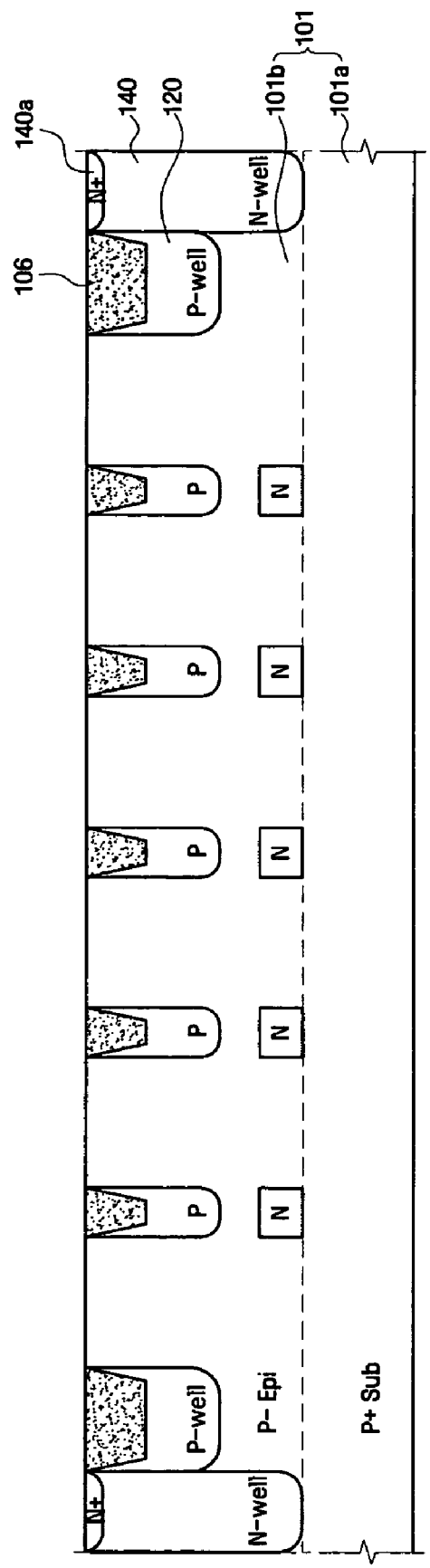

Hereinafter, a method for fabricating an image sensor according to an exemplary embodiment of the present invention will be described with reference to the accompanying drawings. FIGS. 10a to 10c are cross-sectional views for explaining the intermediate steps of the method for fabricating the image sensor according to an exemplary embodiment of the present invention.

Referring to FIG. 10a, an element isolation film 106 is formed in the substrate 101 to define an active region. The active region can be divided into an active pixel sensor region 102 to be formed with an active pixel sensor array, and a peripheral region 104 to be formed with peripheral circuits.

Then, impurity ions are implanted below the element isolation film 106 to form a second conductivity-type isolation well 120 for reducing horizontal crosstalk In this regard, the isolation well can be formed to a depth that is substantially the same or deeper than that of a photodiode.

Referring to FIG. 10b, a first conductivity-type first deep well 130 is formed in the active pixel sensor region 102 in a location which does not include a plurality of first conductivity-type photodiodes 110 to be arranged in a matrix form within the active pixel sensor region. Herein, the first deep well 130 is formed at a location of about 1 to about 5 μm from the substrate surface by doping impurity ions at a peak doping concentration of about $1 \times 10E12$ atoms/cm$^3$ to about $1 \times 10E14$ atoms/cm$^3$.

Moreover, the first deep well 130 and the connection well (see reference numeral 136 in FIG. 3) can be formed at the same time. The connection well 136 can be formed at the same depth and peak doping concentration as those of the first deep well 130.

Referring to FIG. 10c, a first conductivity-type guard ring 140 is formed in the peripheral region 104 so as to surround the active pixel sensor array. The guard ring 140 can be formed to be connected with the connection well 136 through, for example, multiple ion implantations.

Also, on the surface of the substrate 101 having the guard ring 140 formed thereon, an ohmic contact layer 140a can be selectively formed.

Referring again to FIG. 4, the photodiode 110 and the pinning layer 112 are formed on the active pixel sensor region by implanting impurity ions. Herein, the photodiode 110 and the pinning layer 112 are formed through two different ion implantation processes. For example, first conductivity-type impurity ions are implanted deeper than the surrounding source and drain regions to form the photodiode 110, and second conductivity-type impurity ions are implanted onto the photodiode 110 at low energy and high dose to form the pinning layer 112 near the surface of the substrate 101. In this regard, the doping concentration and location may be varied depending on the fabrication process and design, and thus the exemplary embodiments are not limited thereto.

Although the image sensor according to the present exemplary embodiment has been described as being formed in the order of the isolation well 120, the first deep well 130, the guard ring 140, the photodiode 110 and the pinning layer 112, it is apparent to those skilled in the art that this order may be varied depending on the fabrication process and design.

Figure 11:
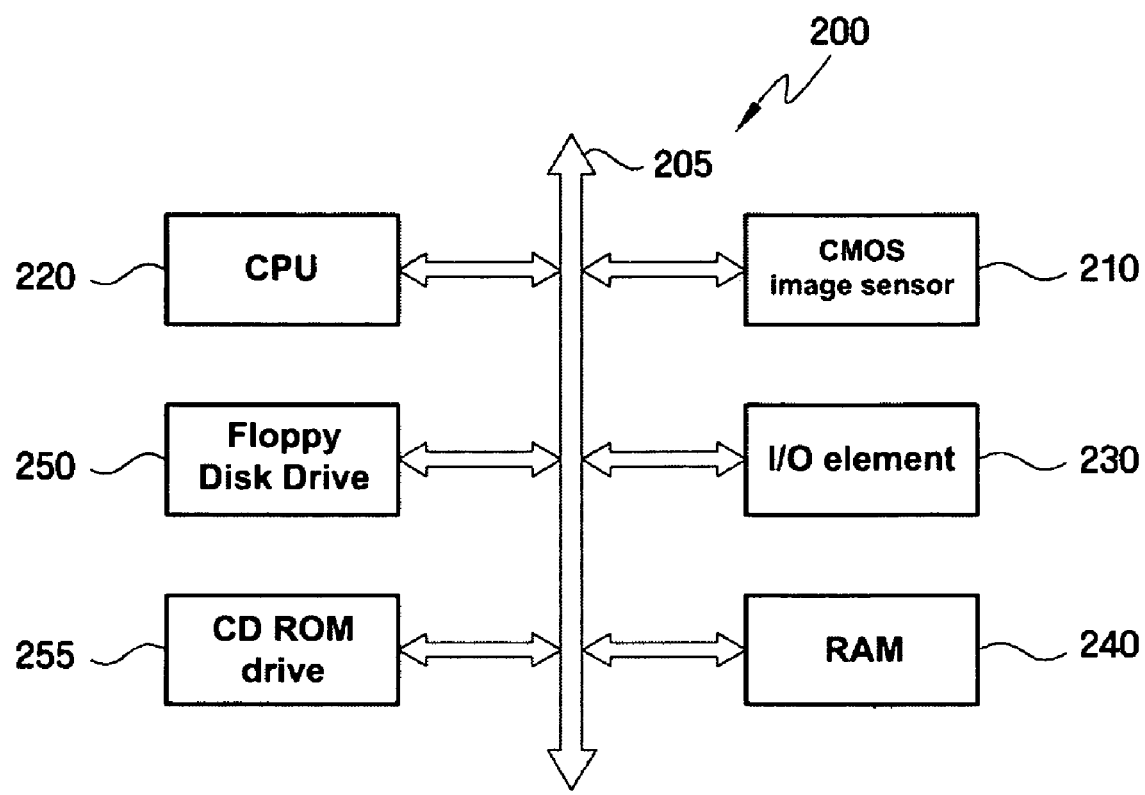
FIG. 11 is a schematic diagram showing a processor-based system including an image sensor according to an exemplary embodiment of the present invention.

FIG. 11 is a schematic diagram showing a processor-based system including the image sensor according to an exemplary embodiment of the present invention.

Referring to FIG. 11, a processor-based system 201 is a system for processing an image output from a CMOS image sensor 210. Examples of the system 201 may include computer systems, camera systems, scanners, machined watch systems, navigation systems, videophones, monitoring systems, automatic focus systems, tracking systems, operation monitoring systems, and image stabilization systems, but are not limited thereto.

For example, the process-based system, such as a computer system, comprises a central processing unit (CPU) 220, such as a microprocessor, which can communicate with an input/output element 230 through a bus line 205. The CMOS image sensor 210 can communicate with the system through the bus line 205 or other communication links. Also, the processor-based system 201 may further comprise, for example, RAM 240, a floppy disk drive 250 and/or a CD ROM drive 255, and a port 260, which can communicate with the CPU 220 through the bus line 205. The port 260 can be a port that can couple, for example, a video card, a sound card, a memory card, a USB element and the like, or communicate data with other systems. The CMOS image sensor 210 can be integrated with a CPU, a digital signal processor (DSP) or a microprocessor. Moreover, the CMOS image sensor 210 may also be integrated with memories and in some cases, it may also be integrated on a chip separate from a processor.

The image sensor of the exemplary embodiments of the present invention may produce at least one or more of the following benefits set forth below . For example, electrical crosstalk that can occur due to long-wavelength light can be reduced by the image sensor of the exemplary embodiments of the present invention. Accordingly, image distortion, poor tint and blooming may all be reduced, and thus image reproduction characteristics may also be improved. Also, as charges generated by long-wavelength light can accumulate in the photodiode region, the sensitivity of the photodiode region to long-wavelength light can be increased.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. An image sensor comprising:
   a substrate having an active pixel sensor region defined therein;
   a plurality of first conductivity type photodiodes formed in the active pixel sensor region;
   a first conductivity-type first deep well formed in the active pixel sensor region in a location which does not include the plurality of the first conductivity-type photodiodes, the first deep well being electrically connected to a positive voltage; and
   a second conductivity-type second deep well formed at a location deeper than the first deep well in the active pixel sensor region.

2. The image sensor of claim 1, wherein the positive voltage is a power supply voltage.

3. The image sensor of claim 1, further comprising a first conductivity-type guard ring, which is formed in the substrate so as to surround the plurality of photodiodes, and wherein the first conductivity-type guard ring is connected to the first conductivity-type first deep well.

4. The image sensor of claim 1, wherein the first conductivity-type first deep well is formed to a depth of about 1 to about 5 μm from a surface of the substrate.

5. The image sensor of claim 1, wherein the first conductivity-type first deep well has a peak doping concentration in a range of about $1\times10E12$ atoms/cm$^3$ to about $1\times10E14$ atoms/cm$^3$.

6. The image sensor of claim 1, wherein the second conductivity-type second deep well is formed below the photodiodes.

7. The image sensor of claim 1, further comprising one of a first conductivity-type epitaxial layer or a second conductivity-type epitaxial layer formed on the substrate and wherein the substrate is a second conductivity type semiconductor substrate.

8. The image sensor of claim 1, further comprising one of a first conductivity-type epitaxial layer or a second conductivity-type epitaxial layer formed on the substrate and wherein the substrate is a first conductivity type semiconductor substrate.

9. An image sensor comprising:
a substrate having an active pixel sensor region and a peripheral region defined therein;
an active pixel sensor array formed in the active pixel sensor region and including a
plurality of first conductivity type photodiodes arranged in a matrix form;
a first conductivity type guard ring formed in the peripheral region so as to surround the active pixel sensor array, and
a first conductivity type first deep well formed in the active pixel sensor region in a location which does not include the plurality of first conductivity type photodiodes, wherein the first deep well is connected to the guard ring and is adapted to receive a voltage through the guard ring.

10. The image sensor of claim 9, wherein the first deep well and the guard ring are connected to each other by a connection well formed in the peripheral region.

11. The image sensor of claim 9, wherein the first conductivity-type first deep well comprises at plurality of first sub-first deep wells extending parallel to one axis of the active pixel sensor array and a plurality of second sub-first deep wells extending parallel to another axis perpendicular to the one axis, and wherein the plurality of first sub-first deep wells and the plurality of second sub-first deep wells cross each other.

12. The image sensor of claim 11, wherein the first deep well and the guard ring are connected to each other through the connection well formed in the peripheral region, and the connection well comprises a plurality of first sub-connection wells connected to the plurality of first sub-first deep wells, and a plurality of second sub-connection wells connected to the plurality of second sub-first deep wells.

13. The image sensor of claim 9, wherein the positive voltage is a power supply voltage.

14. The image sensor of claim 9, wherein the first conductivity-type first deep well is formed to a depth of about 1 to about 5 μm from the surface of the substrate.

15. The image sensor of claim 9, wherein the first conductivity-type first deep well has a peak doping concentration in a range of about $1\times10E12$ atoms/cm$^3$ to about $1\times10E14$ atoms/cm$^3$.

* * * * *